US008860509B2

(12) United States Patent
Onizuka

(10) Patent No.: US 8,860,509 B2
(45) Date of Patent: Oct. 14, 2014

(54) CLIPPING CIRCUIT, DIFFERENTIAL AMPLIFYING CIRCUIT, AND AMPLIFYING CIRCUIT

(71) Applicant: Kohei Onizuka, Tokyo (JP)

(72) Inventor: Kohei Onizuka, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/709,574

(22) Filed: Dec. 10, 2012

(65) Prior Publication Data

US 2013/0154745 A1 Jun. 20, 2013

(30) Foreign Application Priority Data

Dec. 16, 2011 (JP) ................................ 2011-276243

(51) Int. Cl.
| | |
|---|---|
| H03G 3/30 | (2006.01) |
| H03F 1/02 | (2006.01) |
| H03F 3/45 | (2006.01) |
| H03G 7/08 | (2006.01) |
| H03G 3/20 | (2006.01) |
| H03K 5/08 | (2006.01) |

(52) U.S. Cl.
CPC ............... *H03K 5/08* (2013.01); *H03F 1/0288* (2013.01); *H03F 3/45179* (2013.01); *H03F 2203/45481* (2013.01); *H03F 2200/66* (2013.01); *H03G 7/08* (2013.01); *H03G 3/20* (2013.01); *H03G 3/3042* (2013.01); *H03K 3/68* (2013.01)
USPC ......................... 330/254; 330/295; 330/207 P

(58) Field of Classification Search
CPC ....... H03F 1/52; H03F 1/523; H03F 2200/78; H03F 2200/444; H03F 3/19; H03F 2200/504; H03F 3/217
USPC .................. 330/207 P, 298, 252–261, 278
See application file for complete search history.

(56) References Cited

U.S. PATENT DOCUMENTS

| 6,580,321 | B1 * | 6/2003 | Arell et al. ................. 330/207 P |
| 6,737,905 | B1 | 5/2004 | Noda et al. |
| 7,123,045 | B2 * | 10/2006 | Doi et al. ......................... 326/23 |
| 2004/0080352 | A1 | 4/2004 | Noda et al. |

FOREIGN PATENT DOCUMENTS

| JP | 11-088065 | 3/1999 |
| JP | 2003258581 A | 9/2003 |
| JP | 2008154286 A | 7/2008 |

OTHER PUBLICATIONS

Japanese Office Action dated Jul. 18, 2014 in counterpart Japanese Application No. 2011-276243.

* cited by examiner

*Primary Examiner* — Hieu Nguyen

(74) *Attorney, Agent, or Firm* — Holtz, Holtz, Goodman & Chick PC

(57) ABSTRACT

A clipping circuit includes: a first input terminal which receives a first signal, a second input terminal which receives a second signal, and a first variable resistive element which has a control terminal electrically connected to the second input terminal and which has a threshold, wherein first and second ends of the first variable resistive element are connected to first input terminal and a reference voltage, respectively. The clipping circuit also includes a second variable resistive element which has a control terminal electrically connected to the first input terminal and which has a threshold, wherein first and second ends of the second variable resistive element are connected to a second input terminal and the reference voltage, respectively. In addition, a first bias applying unit applies a bias voltage lower than the threshold to the control terminal regarding the first variable resistive element, and a second bias applying unit applies a bias voltage lower than the threshold to the control terminal regarding the second variable resistive element.

5 Claims, 5 Drawing Sheets a: Ma1 GATE TERMINAL VOLTAGE WAVEFORM WITH CLIPPING CIRCUIT CONNECTED
b: Ma2 GATE TERMINAL VOLTAGE WAVEFORM WITH CLIPPING CIRCUIT CONNECTED
c: Ma1 GATE TERMINAL VOLTAGE WAVEFORM WITH CLIPPING CIRCUIT DISCONNECTED
d: Ma2 GATE TERMINAL VOLTAGE WAVEFORM WITH CLIPPING CIRCUIT DISCONNECTED

CLIPPING CIRCUIT, DIFFERENTIAL AMPLIFYING CIRCUIT, AND AMPLIFYING CIRCUIT

CROSS REFERENCE TO RELATED APPLICATIONS

This application is based upon and claims the benefit of priority from the prior Japanese Patent Application No. 2011-276243, filed on Dec. 16, 2011, the entire contents of which are incorporated herein by reference.

FIELD

Embodiments described herein relate to a clipping circuit, a differential amplifying circuit and an amplifying circuit, and for example, relate to a technology for controlling amplitude of an AC signal.

BACKGROUND

In a situation where a device such as an amplifier receives a large amplitude signal which would make node voltage of the device higher than its withstand voltage, the amplitude of the signal is conventionally limited by a clipping circuit which uses fixed forward voltage of a diode to protect the device.

There has also been used a clipping circuit which uses avalanche breakdown caused by inserting a device different in withstand voltage from the main device in parallel with a main device used for amplification and the like.

In the above clipping circuit using the forward voltage of diode, the number of the diodes to be connected in series is adjusted to control clipping voltage. The forward voltage of a silicon diode is generally 0.6 V, and this voltage is used as a minimum adjustment unit. However, in miniaturization of CMOS process and the like, gate withstand voltage is lowered to about 1 V, which makes it necessary to control a clipping amount in several dozen mV order. Accordingly, the above diode clipping scheme is not sufficient in control resolution of the clipping amount and is therefore not applicable. Since MOSFET threshold values are not correlated with manufacturing variation of forward voltage of diodes, a compensating circuit needs to be separately provided in order to maintain the clipping amount constant regardless of the variation.

Further, the above clipping circuit using the avalanche breakdown has few options regarding the withstand voltage of transistors which can be manufactured on the same wafer by such process as CMOS process. When the withstand voltage of a high withstand voltage transistor is close to or equal to the withstand voltage of a low withstand voltage transistors, a clipping effect cannot be acquired.

DETAILED DESCRIPTION

According to some embodiments, there is provided a clipping circuit, including: a first input terminal, a second input terminal, a first variable resistive element, a second variable resistive element, a first bias applying unit and a second bias applying unit.

The first input terminal receives a first signal. A pair of the first signal and a second signal forms a differential signal as a clipping target.

The second input terminal receives the second signal.

The first variable resistive element has a control terminal electrically connected to the second input terminal and has a threshold. A first end of the first variable resistive element is connected to the first input terminal and a second end of the first variable resistive element is connected to a reference voltage.

The second variable resistive element has a control terminal electrically connected to the first input terminal and has a threshold. A first end of the second variable resistive element is connected to the second input terminal, and a second end of the second variable resistive element is connected to the reference voltage.

The first bias applying unit applies a bias voltage lower than the threshold of the first variable resistive element to the control terminal of the first variable resistive element.

The second bias applying unit applies a bias voltage lower than the threshold of the second variable resistive element to the control terminal of the second variable resistive element.

Here in below, the embodiments of the present invention will be described in detail with reference to the accompanying drawings.

(First Embodiment)

Figure 1:
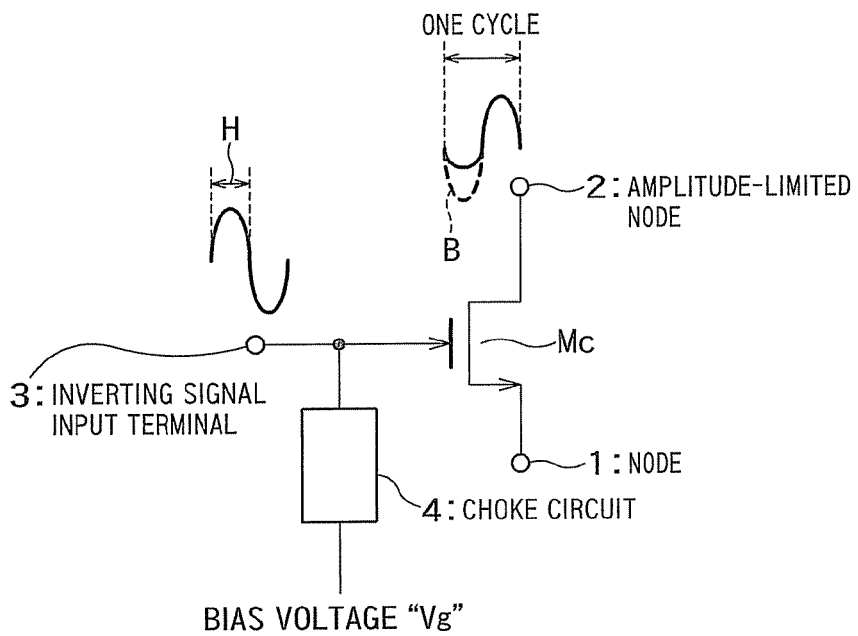
FIG. 1 is a view showing a clipping circuit according to a first embodiment.

FIG. 1 is a block diagram showing a clipping circuit according to a first embodiment.

The clipping circuit of FIG. 1 has an NMOS transistor Mc as a variable resistive element with a threshold. A drain terminal of the NMOS transistor Mc is connected to an amplitude-limited node (input terminal) 2, while a source terminal thereof is connected to a node 1 with an arbitrary bias voltage applied thereto. The amplitude-limited node 2 is a node that receives an AC signal (amplitude-limited signal) which is subjected to amplitude limiting (clipping). A gate terminal of the NMOS transistor Mc is connected to one end of a choke circuit 4. The other end of the choke circuit 4 is connected to a bias voltage "Vg".

The choke circuit herein refers to a circuit having sufficiently high impedance against an AC signal which is to be processed by the clipping circuit and having low impedance against a direct current (DC). For example, the choke circuit 4 may be made of a high resistance element. Alternatively, the choke circuit 4 may be made of an inductive element.

An inverting signal input terminal 3 receives an inverted signal of the amplitude-limited signal, and this inverted signal is inputted into the gate terminal of the NMOS transistor Mc. As the inverted signal, an appropriate signal may be taken out directly from a circuit connected to a preceding stage or a subsequent stage of the clipping circuit or may be generated in an inverting circuit separately provided to invert the amplitude-limited signal.

The bias voltage "Vg" is herein so set that an overdrive voltage of the NMOS transistor Mc, i.e., a value obtained by subtracting a threshold voltage "Vth" of the transistor Mc from a difference between "Vg" and voltage of the node 1, becomes negative. In short, the bias voltage of the NMOS transistor Mc is set to be lower than the threshold voltage of the NMOS transistor Mc.

As a consequence, when the amplitude of an AC signal (amplitude-limited signal) is zero or sufficiently small, the NMOS transistor Mc is put in a cut off state, so that amplitude limiting is not performed. When the amplitude of an AC signal increases, the NMOS transistor is turned on in a section (section H of FIG. 1) where the voltage of an inverted signal exceeds the threshold of the NMOS transistor during one cycle. Accordingly, a line between the amplitude-limited node 2 and the node 1 is short-circuited with low resistance, and thereby a negative-side amplitude of the amplitude-limited signal is limited (waveform portion B of a dotted line in FIG. 1 is limited).

In this case, the node 1 is preferably AC-grounded with low impedance compared with a low resistance value between the amplitude-limited node 2 and the node 1, and a DC-bias point may take any value.

Since an equivalent resistance value between the source and drain terminals in the NMOS transistor Mc more decreases with higher amplitude of the inverted signal, effective clipping can be achieved even in a device with a small channel width.

An absolute clipping amount is mainly determined by a ratio between an impedance of a peripheral circuit connected to the amplitude-limited node 2 and an equivalent resistance of the NMOS transistor Mc. Accordingly, by adjusting the channel width of the NMOS transistor Mc, the limit amount can minutely be set, and thereby high limit resolution can be obtained.

It is to be noted that instead of the NMOS transistor, a PMOS transistor, a bipolar transistor or the like may be used as an element serving as a variable resistive element.

Figure 2:
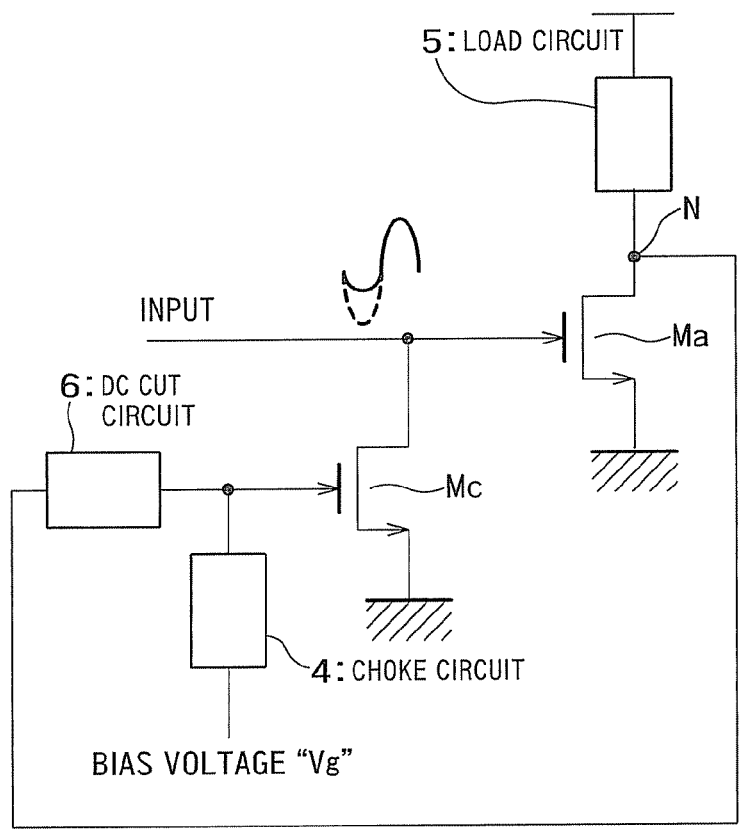
FIG. 2 is a view showing an amplifying circuit including the clipping circuit of FIG. 1.

FIG. 2 is a block diagram showing an amplifying circuit including the clipping circuit of FIG. 1.

The amplifying circuit of FIG. 2, with use of the clipping circuit of FIG. 1, clips an input voltage amplitude (amplitude-limited signal) at a gate terminal of an NMOS transistor Ma serving as an amplifying element, i.e., limits a negative-side amplitude of the amplitude-limited signal so as to obtain a withstand voltage margin of the NMOS transistor Ma.

The clipping circuit of FIG. 1 is connected to a source-grounded inverting amplifier made up of the NMOS transistor Ma and a load circuit 5. The NMOS transistor Ma has a source terminal being grounded and a drain terminal being connected to the load circuit 5. The NMOS transistor Ma inverts and amplifies an input voltage inputted into the gate terminal. Although inversion and amplification are simultaneously performed in the form of a common source circuit in this embodiment, an amplifier that amplifies an input signal in phase may be used and a phase inverter that inverts the phase of the signal amplified by the amplifier may separately be added to constitute an amplifying circuit.

The amplitude-limited node 2 of the clipping circuit is electrically connected to the gate terminal of the NMOS transistor Ma. The inverting signal input terminal 3 is connected to the drain terminal of the NMOS transistor Ma via a DC cut circuit 6, i.e., connected to an intermediate node N which connects the NMOS transistor Ma and the load circuit 5.

Since an inversion-amplified signal of an amplitude-limited signal appears at the intermediate node N, the signal is used as a control voltage of the clipping circuit. This makes it possible to clip an input voltage amplitude of the inverting amplifier and to thereby obtain a withstand voltage margin of the NMOS transistor Ma.

The DC cut circuit 6 cuts a DC component of the bias voltage in the intermediate node N between the NMOS transistor Ma and the load circuit 5. By applying a bias voltage "Vg" to the NMOS transistor Mc via the choke circuit 4, a bias voltage "Vg" of the clipping circuit is independently set. This makes it possible to prevent the NMOS transistor Mc from constantly being in an ON state when the bias voltage of the intermediate node N exceeds a threshold of the clipping circuit (a threshold of the NMOS transistor Mc). To be concrete, the DC cut circuit 6 may be made of a sufficiently large capacity and the like.

Thus, the DC cut circuit 6 and the choke circuit 4 constitute a bias applying unit that applies a bias voltage smaller than the threshold of the NMOS transistor Mc to the control terminal of the NMOS transistor Mc.

It is to be noted that the variable resistive element Mc for clipping and the amplifying element Ma may be made of a PMOS transistor, a bipolar transistor or the like. The amplifying element and the variable resistive element for clipping may also be made of transistors having an identical threshold and an identical size. The amplifying element and the variable resistive element for clipping may also be made of devices manufactured in an identical manufacturing process. The amplifying element and the variable resistive element for clipping may also be devices different in parameters such as the threshold.

According to the present embodiment as described above, by adjusting the parameters such as the voltage of the node 1, the bias voltage of the control terminal in the variable resistive element, and resistance characteristics (such as a central value, a threshold and control signal dependency) of the variable resistive element, it becomes possible to implement a clipping circuit with high control resolution and arbitrary limiting characteristics.

Moreover, using an output voltage of the inverting amplifying circuit as a control signal of the clipping circuit makes it possible to reduce the number of elements for use in clipping. It also becomes possible to enhance control resolution of the clipping amount.

(Second Embodiment)

Figure 3:
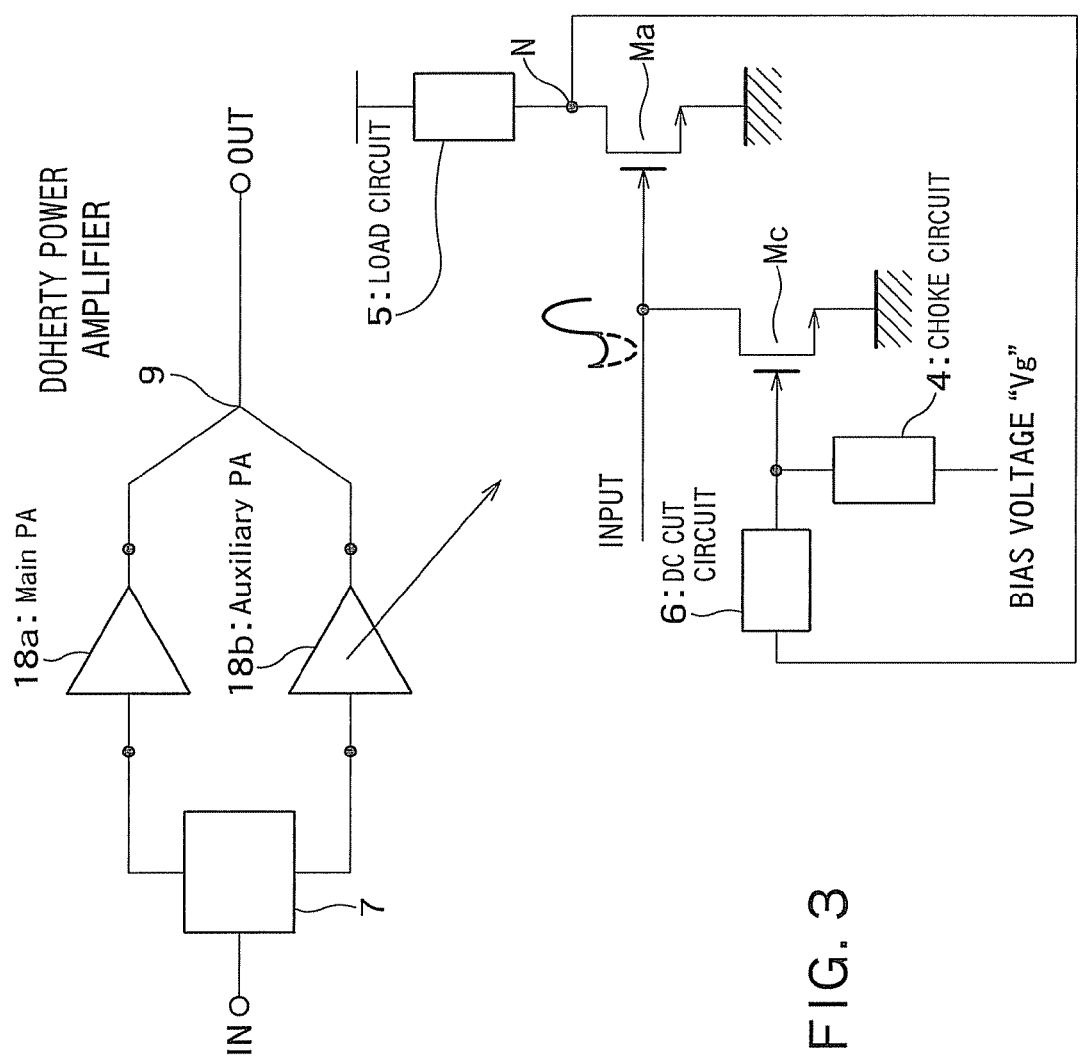
FIG. 3 is a view showing a Doherty power amplifier according to a second embodiment.

FIG. 3 is a block diagram showing a Doherty power amplifier according to a second embodiment of the present invention.

In this embodiment, the inverting amplifying circuit (see FIG. 2) shown in the first embodiment is applied as an auxiliary amplifier of the Doherty power amplifier.

The Doherty power amplifier includes a main amplifier 8a having high linearity, an auxiliary amplifier 8b of class C operation which has an increased gain at the time of large power output, a power dividing unit 7 that performs power dividing of an input signal serving as an amplification target and outputs divided power to the main amplifier 8a and the auxiliary amplifier 8b, and a power combining unit 9 that combines an output of the main amplifier 8a with an output of the auxiliary amplifier 8b and outputs the combined output. In the drawing, only the principal components of the Doherty power amplifier are shown, and various elements (for example, ¼ wavelength line) placed on the input side of the auxiliary amplifier 8b and on the output side of the main amplifier 8a are omitted.

In order to implement class C operation of the amplifier, a bias point thereof needs to be set lower than a threshold of the amplifying element. For example, in the present embodiment, a gate bias of the amplifying element (NMOS transistor) Ma is set to have a low value. Generally, as the amplitude of an input signal increases, a negative side-peak value of a gate voltage of an NMOS transistor takes a negative value which is considerably less than a source voltage. As a result, when an amplifying device is manufactured by a fine CMOS process for example, a gate-drain voltage would exceed the withstand voltage. Contrary to this, in the present embodiment, a clipping circuit is inserted, so that in the vicinity of a minimum peak point of an input signal, a line between the gate terminal and the ground of the NMOS transistor Ma is short-circuited with low impedance and thereby voltage amplitude is limited. Accordingly, a withstand voltage margin of the NMOS transistor Ma is obtained.

Even when a channel width of the NMOS transistor Mc is sufficiently smaller (1/10 to 1/20) than the channel width of the NMOS transistor Ma, effective operation can still be achieved. Accordingly, an occupied area overhead by addition of the clipping circuit is small.

According to the present embodiment as described above, limiting the voltage applied to the amplifying element of the auxiliary amplifier makes it possible to obtain a withstand voltage margin even in the case of using the amplifying element having a low withstand voltage.

(Third Embodiment)

Figure 4:
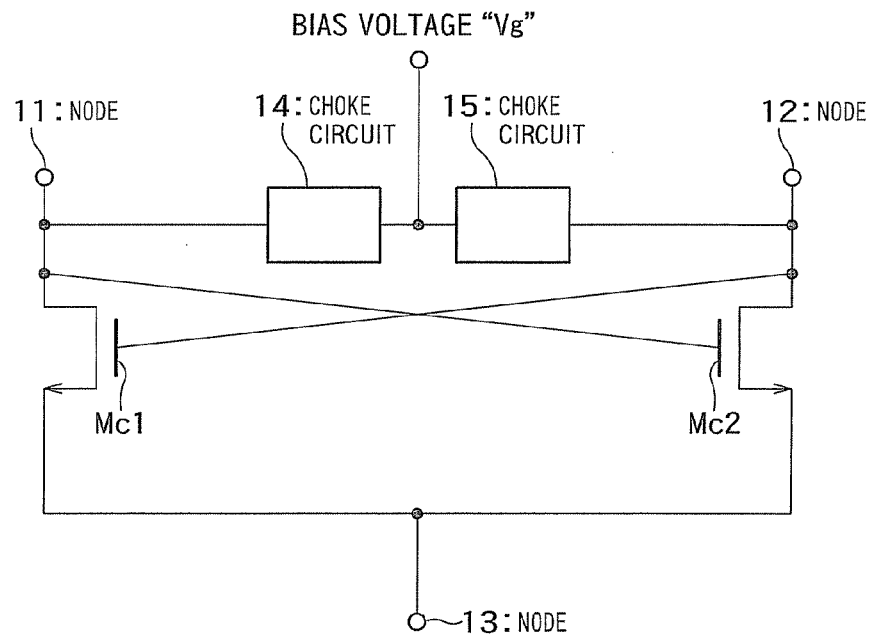
FIG. 4 is a view showing a clipping circuit according to a third embodiment.

FIG. 4 is a block diagram showing a clipping circuit according to a third embodiment of the present invention.

In this embodiment, NMOS transistors Mc1 and Mc2 are used as variable resistive elements. A node 11 and a node 12 (first and second input terminals) are equivalent to the amplitude-limited node. The nodes 11 and 12 are connected to drain terminals of the NMOS transistors Mc1 and Mc2. A first signal and a second signal a pair of which constitutes a differential signal serving as a clipping target are given to the nodes 11 and 12.

A drain terminal of the NMOS transistor Mc1 is connected to a bias voltage "Vg" via a choke circuit (bias applying unit) 14 and is also connected to a gate terminal of the NMOS transistor Mc2.

A drain terminal of the NMOS transistor Mc2 is connected to the bias voltage "Vg" via a choke circuit (bias applying unit) 15 and is also connected to a gate terminal of the NMOS transistor Mc1.

Source terminals of the NMOS transistors Mc1 and Mc2 are commonly connected to a node 13 with an arbitrary bias voltage applied thereto.

With the above configuration, a gate terminal of the transistor Mc2 connected to the node 11 and a gate terminal of Mc1 connected to the node 12 are driven by a signal with a reversed phase of the signal given to the nodes 11 and 12, which are connected to the drain terminals of the transistors.

Therefore, in the vicinity of a negative side-peak of the input signal inputted, into the node 11, a reversed-phase signal (signal in the vicinity of a positive-side peak) from the node 12 is given to the gate terminal of the NMOS transistor Mc1. As a result, a line between the node 11 and the node 13 is short-circuited with low resistance, and thereby the negative side-amplitude is limited. Similarly, in the vicinity of a negative side-peak of the input signal inputted into the node 12, a reversed-phase signal (signal in the vicinity of a positive-side peak) from the node 11 is given to the gate terminal of the NMOS transistor Mc2. As a result, a line between the node 12 and the node 13 is short-circuited with low resistance, and thereby the negative side-amplitude is limited. Thus, a minimum peak of the input signal in each of the nodes 11 and 12 is limited.

It is to be noted that a PMOS transistor, a bipolar transistor or the like may be used as an element serving as a variable resistive element. An inductive element may be used in place of the resistor element for the choke circuit.

According to the present embodiment as described above, it becomes possible to reduce the number of elements for use in clipping by controlling the variable resistance using mutually reversed phase signals (first signal and second signal) forming the differential signal.

(Fourth Embodiment)

Figure 5:
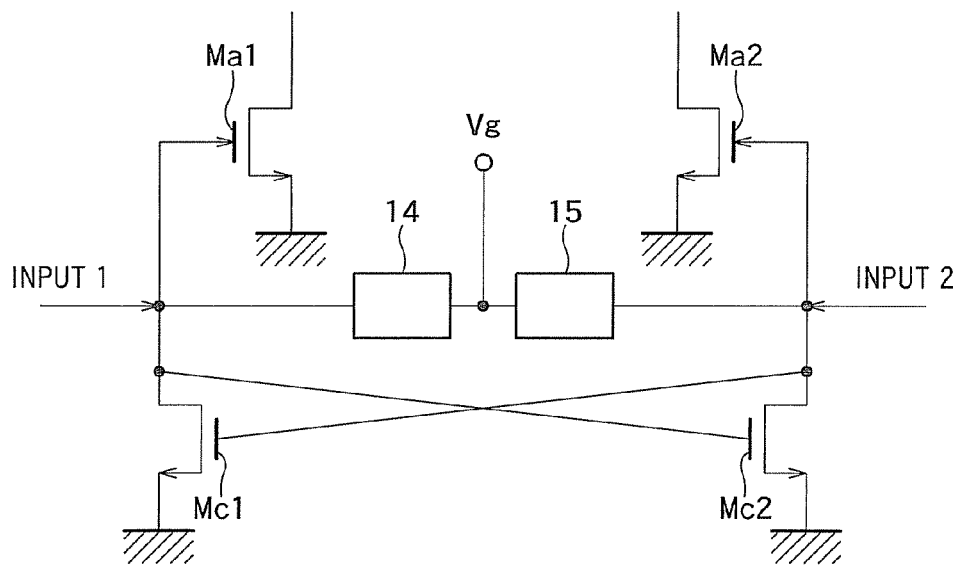
FIG. 5 is a view showing a differential amplifying circuit including the clipping circuit of FIG. 4 according to a fourth embodiment.

FIG. 5 is a block diagram showing a differential amplifying circuit including the clipping circuit of FIG. 4 according to a fourth embodiment of the present invention.

In this differential amplifying circuit, the clipping circuit of FIG. 4 is applied to a differential common source amplifying circuit made up of NMOS transistors Ma1 and Ma2 serving as amplifying elements, so that a gate-drain withstand voltage margin of the NMOS transistors Ma1 and Ma2 is obtained.

An amplitude-limited node 11 (see FIG. 4) is connected to a gate terminal (first input terminal) of the NMOS transistor Ma1, and an amplitude-limited node 12 is connected to a gate terminal (second input terminal) of the NMOS transistor Ma2.

The amplitude-limited nodes 11 and 12 receive a first signal and a second signal, which forms a differential signal, as amplification target signals.

When the bias voltage of the NMOS transistors Ma1 and Ma2 is equal to or less than a threshold, the NMOS transistors Ma1 and Ma2 as amplifying elements and the NMOS transistors Mc1 and Mc2 as clipping elements use the same bias power supply, so that their configuration can be simplified. In the case where their respective bias points need separate setting, DC cut may be implemented by using such method as capacity coupling so as to supply separate bias voltages (see FIG. 2).

In this case, the NMOS transistors Ma1, Ma2 and the NMOS transistors Mc1, Mc2 may have the same threshold characteristics. This can be achieved, for example, by manufacturing these transistors by an identical manufacturing process. Accordingly, when the threshold of devices have variation due to such cause as manufacturing variation, the thresholds of the amplifying elements and the variable resistive elements follow after the variation in a similar manner. As a consequence, it becomes possible to enhance tolerance of variation in difference (margin) between the voltage applied to the amplifying elements at the time of maximum AC signal amplitude, and the withstand voltage. The expression "the same threshold characteristics" used herein does not necessarily indicate "the same" characteristics in a strict sense. Rather, a generally tolerable range of variation, such as about 5 to 10% variations, shall be included in the range of "the same characteristics".

Figure 6:
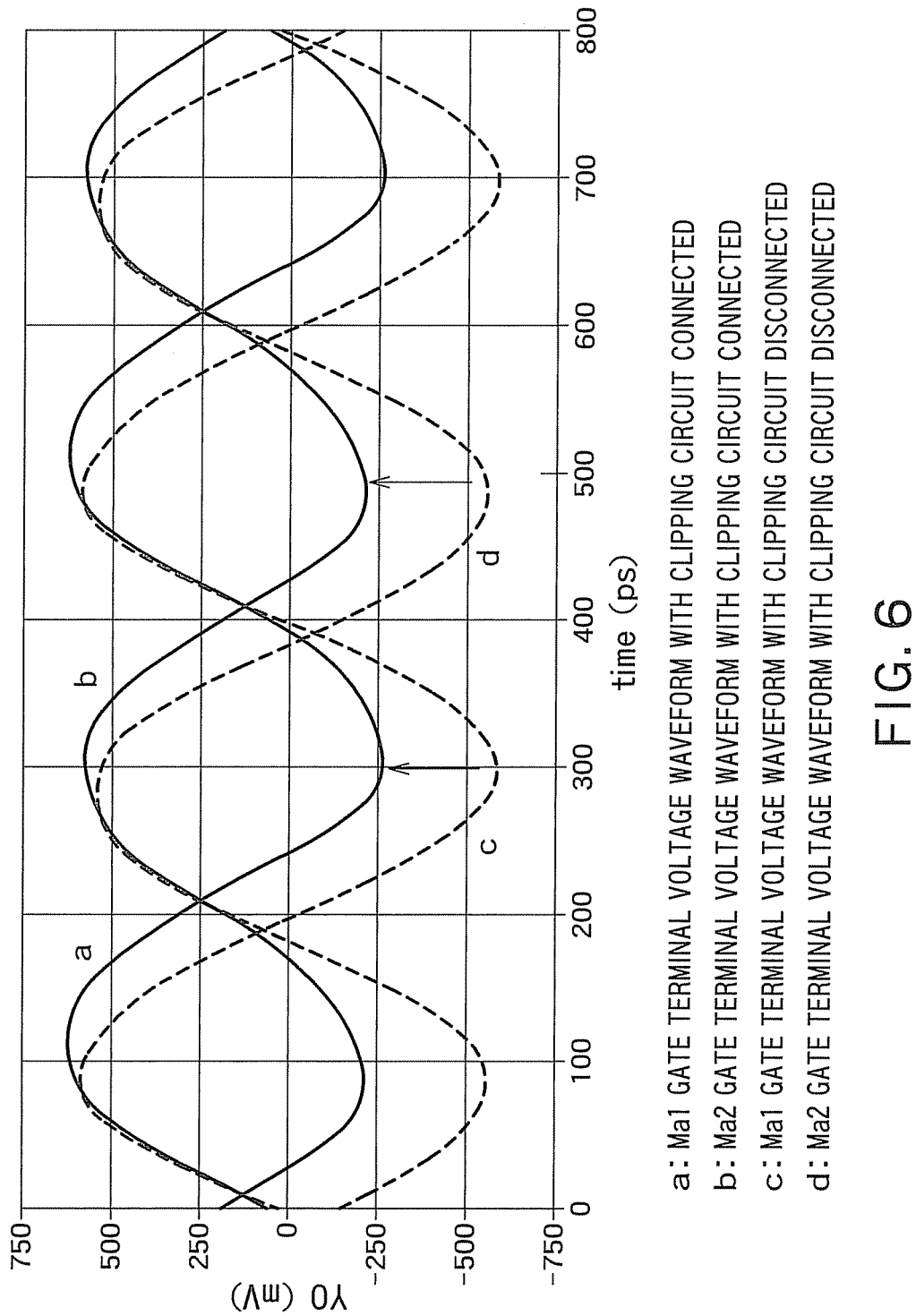
FIG. 6 is a view showing the result of a simulation for demonstrating an effect of the fourth embodiment.

FIG. 6 shows the result of a simulation in which gate voltage amplitude of the amplifying elements Ma1 and Ma2 is compared with use of the circuit of FIG. 5 (with the clipping circuit connected) and a circuit formed by removing the clipping circuit from the circuit of FIG. 5 (with the clipping circuit disconnected).

Graph a shows a voltage waveform in the gate terminal of the amplifying element Ma1 connected to the clipping circuit, Graph b shows a voltage waveform in the gate terminal of the amplifying element Ma2 connected to the clipping circuit, Graph c shows a voltage waveform in the gate terminal of the amplifying element Ma1 disconnected from the clipping circuit, and Graph d shows a voltage waveform in the gate terminal of the amplifying element Ma2 disconnected from the clipping circuit.

The result indicates that when the clipping circuit of the present embodiment is applied, the positive-side gate voltage amplitude, which has influence on amplification characteristics of the amplifier, is maintained constant, while the negative-side gate voltage amplitude, which has little influence on the amplification characteristics and which decreases the withstand voltage margin of the amplifying elements Ma1 and Ma2, is effectively limited.

According to the present embodiment as described above, it becomes possible to protect the amplifying elements even in the case where the voltage inputted into the amplifying elements is limited and an AC signal exceeding the withstand voltage of the amplifying elements is inputted. It also becomes possible to enhance control resolution of the clipping amount, and to also enhance device variation tolerance. It also becomes possible to implement effective clipping even in a case of using a manufacturing process where types of elements that can be integrated are restrictive, such as in CMOS process.

(Fifth Embodiment)

Figure 7:
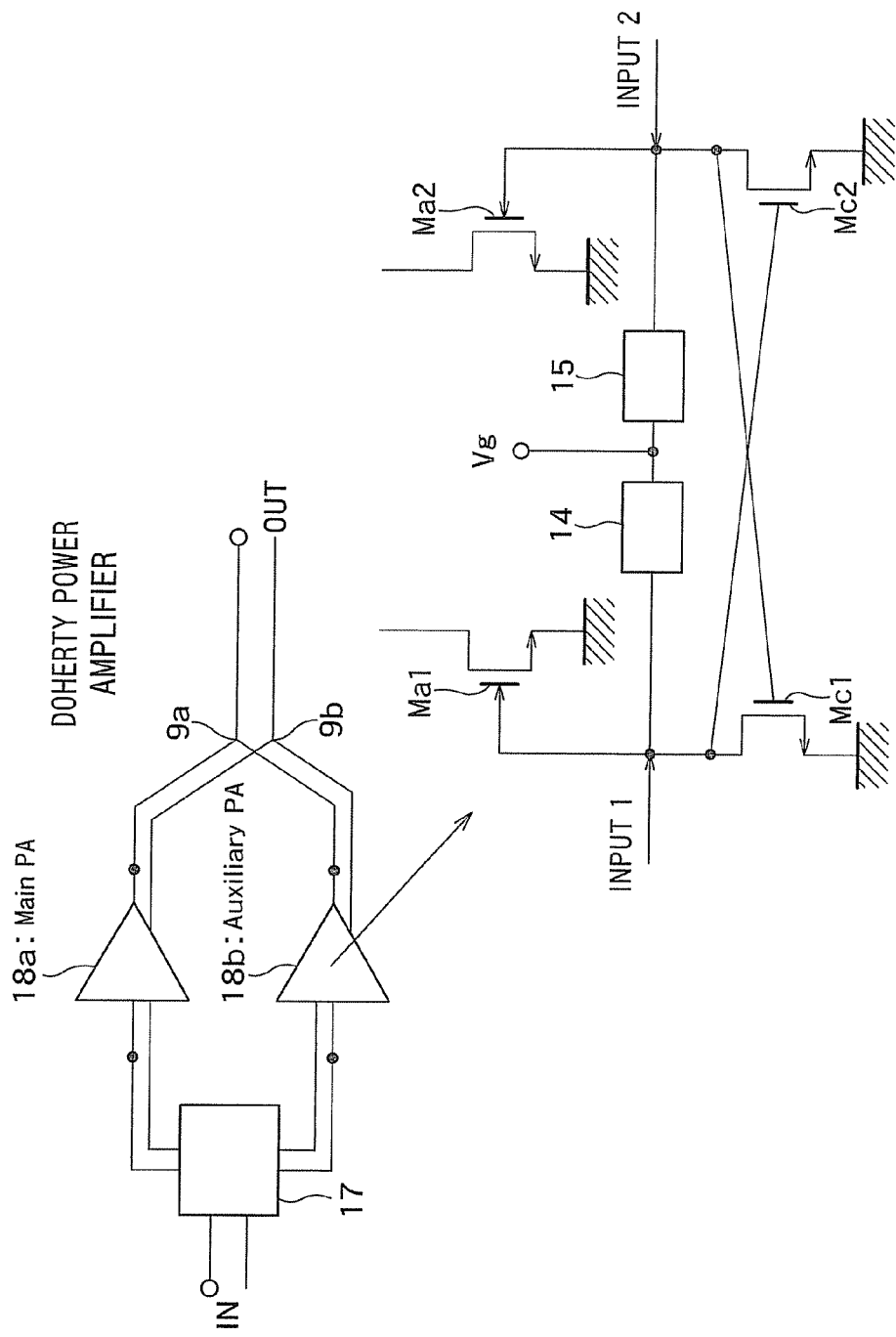
FIG. 7 is a view showing a differential Doherty power amplifier according to a fifth embodiment.

FIG. 7 is a block diagram showing a differential Doherty power amplifier according to a fifth embodiment of the present invention.

In the differential Doherty power amplifier, the differential amplifying circuit (see FIG. 5) shown in the fourth embodiment is applied as an auxiliary amplifier 18b of the differential Doherty power amplifier.

A power dividing unit 17 power-divides an inputted differential signal serving as an amplification target into two signals (first differential signal and second differential signal). A main amplifier 18a amplifies the first differential signal. The auxiliary amplifier 18b amplifies the second differential signal. Power combining units (9a, 9b) combine an output of the main amplifier 18a with an output of the auxiliary amplifier 18b and output the combined output. Since more detailed effects and operation of this configuration are clear from the second embodiment, the description thereof will be omitted.

Also in the present embodiment, effective operation can still be achieved even when a channel width of the NMOS transistors Mc1 and Mc2 as the clipping elements is sufficiently smaller (1/10 to 1/20) than the channel width of the NMOS transistors Ma1 and Ma2. Therefore, an occupied area overhead by addition of the clipping circuit is small.

According to the present embodiment as described above, in the differential Doherty power amplifier, limiting the voltage applied to the amplifying element of the auxiliary amplifier makes it possible to obtain a withstand voltage margin even in the case of using the amplifying element having a low withstand voltage.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A clipping circuit, comprising:
a first input terminal to receive a first signal, a pair of the first signal and a second signal forming a differential signal as a clipping target;
a second input terminal to receive the second signal;
a first variable resistive element having a control terminal electrically connected to the second input terminal and having a threshold, a first end of the first variable resistive element being connected to the first input terminal and a second end of the first variable resistive element being connected to a reference voltage;
a second variable resistive element having a control terminal electrically connected to the first input terminal and having a threshold, a first end of the second variable resistive element being connected to the second input terminal, and a second end of the second variable resistive element being connected to the reference voltage;
a first bias applying unit to apply a bias voltage lower than the threshold of the first variable resistive element to the control terminal of the first variable resistive element; and
a second bias applying unit to apply a bias voltage lower than the threshold of the second variable resistive element to the control terminal of the second variable resistive element.

2. A differential amplifying circuit, comprising:
the clipping circuit according to claim 1;
a first amplifying element to amplify a signal related to a voltage of the first input terminal and output the signal amplified; and
a second amplifying element to amplify a signal related to a voltage of the second input terminal and output the signal amplified.

3. The circuit according to claim 2, wherein the first variable resistive element, the second variable resistive element, the first amplifying element, and the second amplifying element are devices manufactured by an identical manufacturing process.

4. A differential Doherty power amplifier, comprising:
a power dividing unit to divide a differential signal serving as an amplification target into a first differential signal and a second differential signal;
a main amplifier to amplify the first differential signal;
an auxiliary amplifier including the differential amplifying circuit according to claim 2, to amplify the second differential signal; and
a power combining unit to combine an output signal of the main amplifier with an output signal of the auxiliary amplifier.

5. A differential Doherty power amplifier, comprising:
a power dividing unit to divide a signal serving as an amplification target into a first signal and a second signal;
a main amplifier to amplify the first signal;
an auxiliary amplifier including an amplifying circuit to amplify the second signal, wherein the amplifying circuit comprises:
an input terminal to receive a signal;
an inverting amplifying circuit to invert and amplify a signal related to a voltage of the input terminal;
a variable resistive element having a control terminal that receives a signal depending on an output of the inverting amplifying circuit and having a threshold, a first end of the variable resistive element being electrically connected to the input terminal, a second end of the variable resistive element being connected to a reference voltage; and
a bias applying unit to apply a bias voltage lower than the threshold to the control terminal; and
a power combining unit to combine an output signal of the main amplifier with an output signal of the auxiliary amplifier.

* * * * *